United States Patent [19]

Manchester

[11] Patent Number: 4,772,929
[45] Date of Patent: Sep. 20, 1988

[54] HALL SENSOR WITH INTEGRATED POLE PIECES

[75] Inventor: Kenneth E. Manchester, Princeton, Mass.

[73] Assignee: Sprague Electric Company, North Adams, Mass.

[21] Appl. No.: 2,059

[22] Filed: Jan. 9, 1987

[51] Int. Cl.⁴ .............. H01L 27/22; H01L 29/82; H01L 29/96; H01L 43/00
[52] U.S. Cl. ..................... 357/27; 357/55; 360/112
[58] Field of Search ........... 357/27, 55; 360/112; 324/251; 307/309

[56] References Cited

U.S. PATENT DOCUMENTS

| | | | |
|---|---|---|---|
| 2,725,504 | 11/1955 | Dunlap, Jr. | 317/235 |
| 3,114,010 | 12/1963 | Wolf et al. | 179/100.2 |
| 3,146,317 | 8/1964 | Kuhrt et al. | 179/100.2 |
| 3,800,193 | 3/1974 | Ashar et al. | 357/27 |
| 4,021,767 | 5/1977 | Nonaka et al. | 357/27 X |
| 4,180,422 | 12/1979 | Rosvold | |
| 4,186,481 | 2/1980 | Noguchi et al. | 29/603 |
| 4,253,107 | 2/1981 | MacDougall | 357/27 |
| 4,477,853 | 10/1984 | Lemke | 360/125 |
| 4,587,509 | 5/1986 | Pitt et al. | 357/27 X |

*Primary Examiner*—Martin H. Edlow
*Assistant Examiner*—Sara W. Crane

[57] ABSTRACT

A Hall element is formed in one surface of a silicon die. A trench is etched away in the opposite die surface in a region adjacent the Hall element. An insulating silicon dioxide is grown on both surfaces and a layer of ferromagnetic metal is deposited on both surfaces to form a pair of pole pieces intimately integrated with the Hall element.

9 Claims, 2 Drawing Sheets

HALL SENSOR WITH INTEGRATED POLE PIECES

BACKGROUND OF THE INVENTION

This invention relates to a Hall sensor formed in a semiconductor die and more particularly to such a die having layered pole pieces of high magnetic permeability deposited on the opposite major surfaces of the die.

Several known magnetic tape reading heads include a thin semiconductor Hall element sandwiched between two high-magnetic-permeability blocks serving as pole pieces. The semiconductor body is typically a III-V compound such as indium antimonide and only the Hall element is included there. Such materials make Hall elements of high sensitivity as magnetic field sensors but also of high sensitivity to physical stress, vibration and temperature.

It is therefore an object of this invention to provide a Hall sensor that is less sensitive to physical stress, vibration and temprature.

It is a further object of this invention to provide such a sensor wherein the Hall element is formed in a semiconductor die in which may also be integrated a Hall element voltage amplifier.

It is yet a further object of this invention to provide such a Hall element having intimately integrated therewith a pair of magnetic pole pieces.

It is another object of this invention to provide a high resolution magnetic-reading head for use with magnetic tapes, discs and the like.

SUMMARY OF THE INVENTION

A Hall sensor is comprised of a semicondrctor die, a basic Hall element being formed in the die at one surface thereof. A basic trench is formed in the die in the opposite surface and adjacent to the Hall element. A first high permeability layer is deposited over the one die surface in a region adjacent to the Hall element and a second high permeability layer is deposited over the opposite die surface extending into the trench. These two high magnetic permeability layers serve as integrated pole pieces that intimately sandwich the Hall element between them in a gap commensurate with the thickness of the Hall body itself.

The semiconductor is preferably silicon and the deposited pole pieces are preferably of a ferromagnetic metal, e.g. iron and iron alloys. The Hall element is preferably formed in an epitaxial pocket at the one die surface and other epitaxial pockets therein preferably contain circuit elements interconnected to form a Hall-voltage amplifier.

The first and second pole pieces may extend to an edge of the die forming a narrow gap there that may be closed by an audio or digital magnetic tape or disc in a tape or disc reading system. The die may include additional Hall elements like the basic one each with associated amplifier for simultaneously sensing the magnetically encoded messages on a multitrack tape or disc.

A Hall element sensor of silicon exhibits much more stable performance than those made of the III-V semiconductors, albeit the Hall-mobility and Hall sensor sensitivity are considerably less. But the low sensitivity of the silicon Hall element itself is compensated by integrating it with an amplifier achieving both objectives of sensitivity to magnetic field but relative insensitivity to mechanical and thermal influences. But the integrated Hall body is normally made as thin as possible, always thinner than the self-supporting silicon die in which it is formed. This invention recognizes that this later factor puts the integrated Hall element at a disadvantage relative to very simple Hall elements, not integrated and formed in III-V semiconductor compounds which can themselves be very thin and mounted for support on one pole piece.

It is also noteworthy that if one were to deposit pole pieces on either face of an integrated Hall element without a trench, then the gap in which the Hall element is positioned is commensurate with the thickness of the integrated circuit die. Such a large gap in the magnetic circuit represents a large magnetic reluctance. Therefore the minimum dimensions of the pole pieces required for a given application must be made larger in cross section to conduct the magnetic flux without saturation effects. Thus the small gap between pole pieces in the Hall sensors of this invention make implementation of the invention more feasible because the pole pieces may be made thinner. The thinner pole pieces are less difficult and expensive to deposit, and the physical stresses imposed on the sandwiched Hall element by the pole pieces will also be minimized.

DESCRIPTION OF THE PREFERRED EMBODIMENTS

Figure 1:
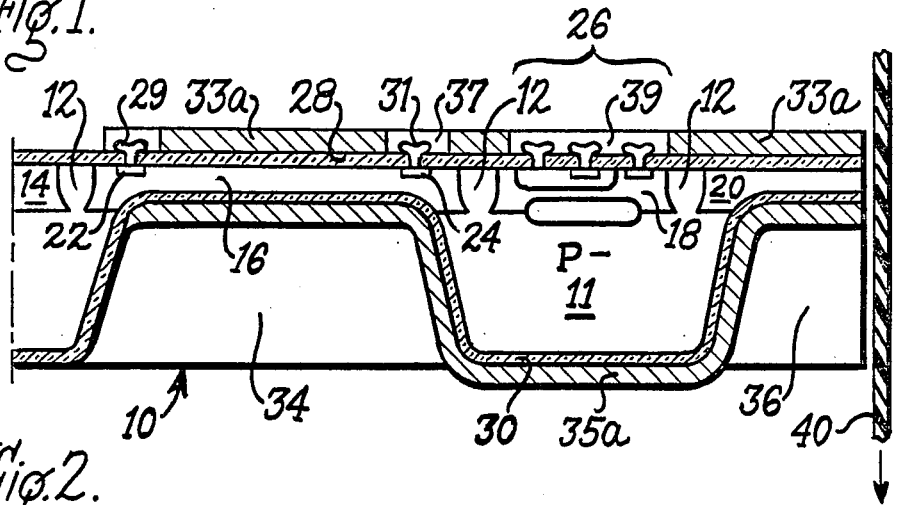
FIG. 1 shows in side sectional view of a portion of a first integrated Hall sensor of this invention.

Referring to FIG. 1, a silicon integrated circuit die 10 has a P-type body 11. Grown on the top surface thereof is an N-type epitaxial layer that is separated by P-type isolation walls 12 and is divided into N-type epitaxial pockets 14, 16, 18 and 20.

Pocket 16 serves here as the body of a standard Hall element having two N+ sensing contact regions 22 and 24 and two energizing contacts (not shown). In the adjacent epitaxial pocket 18, a bipolar transistor 26 is formed, having been made by a standard double diffusion process.

Transistor 26 is but one of the circuit elements integrated in die 10 forming a Hall-voltage amplifier to amplify the output from Hall element 16. Such a silicon integrated Hall element and amplifier are described in the patent to Anselmo et al., U.S. Pat. No. 3,816,766 issued June 11, 1974 and assigned to the same assignee as is the present invention.

A deep trench 34 and a deep trench 36 are formed through the opposite and bottom surface into die 10. This is preferably accomplished by an etching process leading to trenches with sidewalls having a pronounced taper so that in subsequent steps to be described for depositing metal on the bottom die surface, the sidewalls will be more easily covered with the metal. In this embodiment the major surfaces of die 10 lie in the (100) crystal plane.

A well known etchant, potassium hydroxide with isopropyl alcohol and water, is selected as an anisotropic etchant to provide sloping sidewalls. The procedure entails growing a silicon dioxide layer (not shown) on the bottom die surface, depositing a photoresist layer over the silicon dioxide layer, photolithographically opening a hole in the photoresist layer at the area of each wanted trench, etching away the exposed silicon dioxide, e.g. with the standard $SiO_2$ etchant solution of hydrofluoric acid and ammonium flouride, and finally etching away exposed silicon with the anisotropic etchant solution until the silicon trench is at the desired depth. This alkaline etchant does not appreciably attack the silicon dioxide mask or the silicon itself in a direction normal to the (111) plane. The resultant etched trench has flat well defined tapered sidewalls forming an angle of approximately 54.7° with the (111) plane.

Over the top surface of the die 10 a silicon dioxide layer 28 is grown. During the process for growing silicon dioxide layer 28 on the top surface, a silicon dioxide layer 30 is also grown on the bottom surface of die 10. There is subsequently deposited a blanket coating (to become 33a) of a high magnetic permeability material on the silicon dioxide layer 28 over the top die surface and there is deposited a blanket coating (to become 35a) of a high magnetic permeability material over the silicon dioxide layer 30 over the bottom die surface. These magnetic material coatings will serve as pole pieces associated with the Hall sensor body 16 and for that purpose should have a relative (to free space) magnetic permeability greater than 10. Even greater permeability is desirable, e.g. greater than 100. Pure iron has a relative permeability of about 200 and various alloys of iron produce much greater permeabilities, e.g. the well known 45 Permalloy, is an alloy of approximate composition 54.7 Fe, 45 Ni and 0.3 Mn by weight has a maximum permeability of approximately 50,000.

Iron, nickel and their alloys may be deposited by a number of well known processes. For example, a mixture of gaseous compounds of iron and of nickel providing the environment for a $SiO_2$ covered silicon substrate that is at a higher temperature than that of the gasses can be made to decompose the gaseous compounds depositing the metal atom by atom and allowing the metallic elements from those compounds to alloy as they accumulate on the silicon dioxide. As an alternative to that chemical vapor deposition process, iron and nickel may be co-sputtered from two separate pure metal targets of iron and nickel, the relative surface areas of the two targets being adjusted to provide the desired alloy composition. Alternatively, a single iron-nickel alloy target may be used. Yet another deposition method entails the co-evaporation from two separate crucibles of molten iron and nickel, respectively, onto a die substrate.

After any of these deposition methods it is anticipated that a higher permeability material will be obtained if an anneal heating step is performed, e.g. for iron at about 950° C., and for 45 Permalloy at about 1200° C. in a reduced oxygen atmosphere. A 1200° C. anneal may be simultaneously accomplished along with a standard diffusion drive step for transistor emitters and N-type contact impurity when the impurity is arsenic or antimony. A 900° C. anneal may be accomplished simultaneously with a standard POCl emitter drive step.

The blanket layers are then photolithographically masked and partially etched away leaving pole pieces 33a and 35a. This may be accomplished by depositing a silicon dioxide or a silicon nitride layer (not shown) over the top and bottom surfaces of the die 10 by a standard chemical vapor deposition step. Portions of this layer are removed by standard photolithographic processes to form a mask having openings over the permalloy layers through which portions are etched away to define the pole pieces 33a and 35a. A suitable etchant for iron and nickel alloys is a 1.0 normal solution of hydrochloric acid. The pole piece 35a is also cut away to leave openings, e.g. 37 and 39, in regions at which conductive contacts are to be made later to the top surface of chip 10.

Contact windows are cut in the silicon dioxide layer 28 to expose contact regions such as 22 and 24. Aluminum is deposited over the top of the chip 10 and is patterned by the usual photolithographic steps forming contacts 29, 31 etc. to regions of the chip 10.

A protective glass layer (not shown) may be flowed over the top of the aluminum and permalloy and opened only over the aluminum terminal pads (not shown).

In FIG. 1 there is shown passing downward at the right hand edge of die 10, a magnetic tape 40. Tape 40, shown in side sectional view is a recording tape containing ferroelectric particles of iron, ferrite or the like that are capable of being magnetized. An audio or, alternatively, a digital message may be recorded on the tape along a (vertical) track therein that is passed adjacent the edge of die 10.

The high permeability pole pieces 33a and 35a having the Hall element body 16 intimately sandwiched therebetween extend to an edge of die 10 forming an air gap there of a dimension commensurate with the thickness of the epitaxial layer in pocket 20. That gap thickness is typically twenty microns. The magnetic tape 40 essentially closes that gap producing a variable magnetic field through the Hall body 16 that represents the tape audio or digital message. The Hall element transforms the tape message into an electrical signal between Hall sensor conductors 29 and 31.

Figure 2:
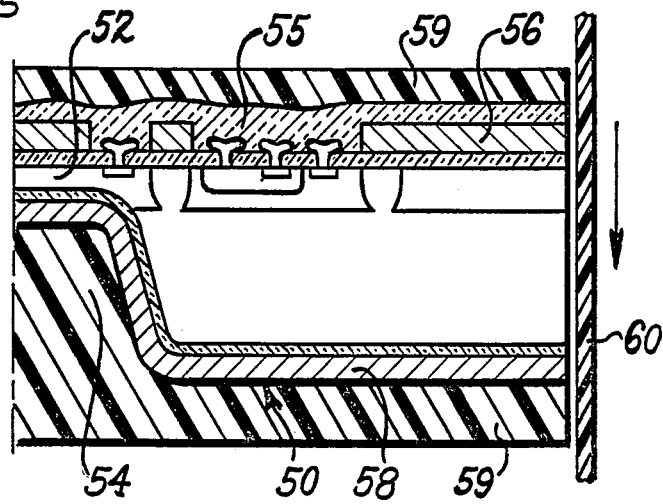
FIG. 2 shows in side sectional view of a portion of a second integrated Hall sensor of this invention.

Referring now to FIG. 2, another integrated circuit die 50 has Hall body 52, a trench 54 under the Hall body 52, and intimate pole pieces 56 and 58, as in the die 10 of FIG. 1. There is no second trough, however, at the edge of die 50. At the right hand edge of die 50 the gap between the magnetic recording tape 60 essentially closes that gap which has a commensurate dimension to the thickness of the die 50. This has the relative advantage that there is less of a magnetic field shorting effect through the semiconductor material at the pickup edge of die 50 of FIG. 2 than in the smaller gap in epitaxial pocket 20 in die 10 of FIG. 1. However, the smaller gap in die 10 offers greater magnetic message resolution and would be the choice when high resolution is required.

An epoxy packaging resin 59 surrounds the Hall sensor chip 50 in FIG. 2, except at the pole-pieces-gap edge of the chip shown at the right hand side. The epoxy, or other resin 59 may have been formed by molding and a thin protective layer (not shown) may be applied to the exposed pole-pieces-gap edge of the chip 50 as desired. Also, prior to molding a passivating glass layer 55 has been flowed over the top chip surface.

Figure 3:
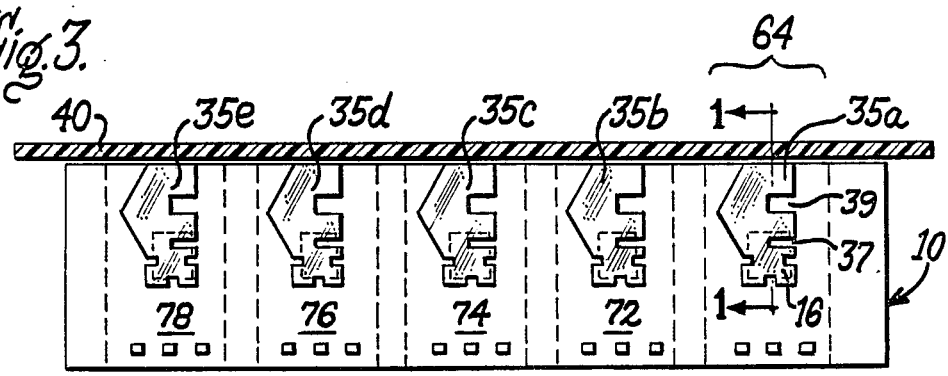
FIG. 3 shows in a top view the Hall sensor of FIG. 1. The cross sectional view portion of said sensor in FIG. 1 is taken in plane 1—1 of FIG. 3.

The multiple-track tape-reading head of FIG. 3 is the top view of the entire die 10 of FIG. 1. The region 64 therein that is enclosed by dashed lines and indicated by the bracket, contains the Hall body 16 and Hall amplifier or other circuits (not depicted in FIG. 3) that may be associated with the Hall sensor 16. The four identical regions 64, 72, 74, 76 and 78 in die 10 shown in FIG. 3 include four additional magnetic tape track sensors. Tape 40, passing vertically downward through the plane of the drawing, may contain five separate messages on each of five tape tracks to be simultaneously sensed or read by the multitrack tape reader die 10.

Figure 4:
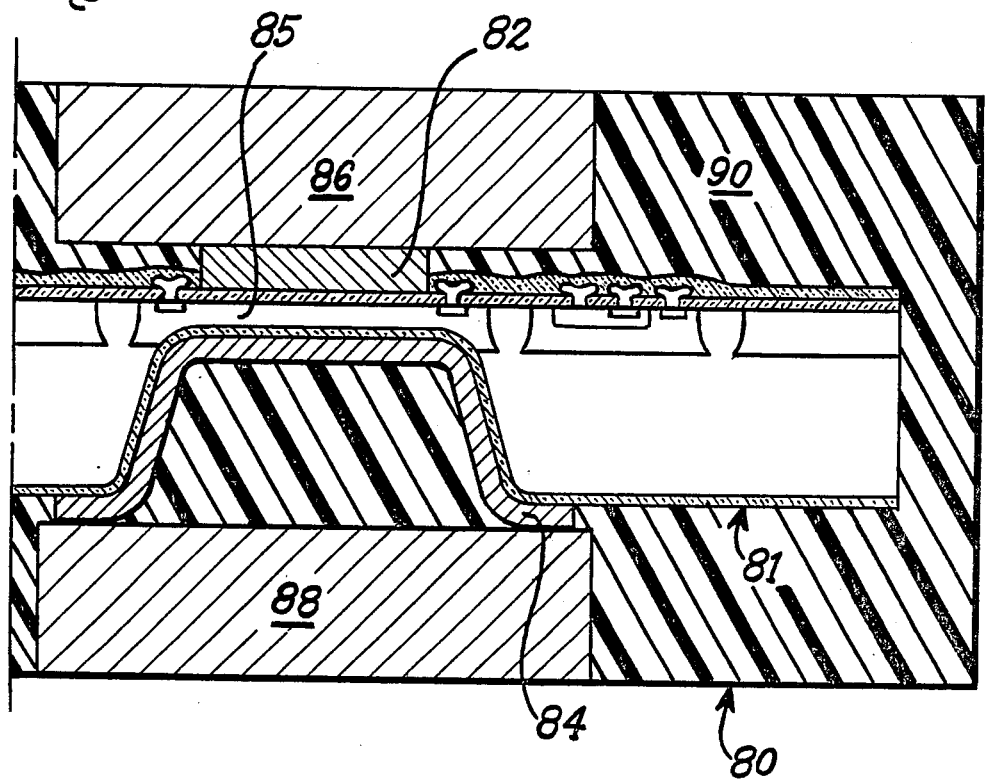
FIG. 4 shows in side sectional view of a portion of a third integrated Hall sensor of this invention.

The magnetic-field-reading package 80 illustrated in FIG. 4 includes a silicon integrated circuit die 81 that is like die 50 of FIG. 2 except for the pole piece layers 82 and 84 on die 81 that only extend a little beyond the Hall body 85 and do not extend to the die edge. This essentially eliminates the field shunting effect, especially evidenced in FIG. 1, of extended portions of pole pieces 33a and 35a. Another pair of high magnetic permeability pole pieces 86 and 88 in FIG. 4 are mounted against integrated pole pieces 82 and 84 respectively.

This assembly is then packaged by casting or molding with epoxy 90 or another resin. The package 80 is suitable for use as a magnetic flux sensor in any magnetic flux circuit. Also, this package may be modified by substituting a bias magnet for pole piece 86 or pole piece 88 and can serve with high sensitivity as a ferromagnetic proximity detector in the modes described by Avery in U.S. Pat. No. 4,443,716 issued Apr. 17, 1984 and assigned to the same assignee as is the present invention.

A Hall element structure having a high conductivity ion-implanted surface portion is particularly well suited for use in integrated circuits of this invention because it may further reduce the "air" gap at the Hall element itself. Such a structure is described in the patent to Macdougall, U.S. Pat. No. 4,253,107 issued Feb. 24, 1981 and assigned to the same assignee as is the present invention.

What is claimed is:

1. A Hall-effect magnetic-field sensor including integrated pole pieces comprising:
   (a) a semiconductor die;
   (b) a basic Hall element being formed in said semiconductor die at one surface thereof and being of the kind having a thin body with two sensing contact regions at opposite edges thereof;
   (c) a basic trench formed in the opposite surface of said die adjacent an inner-die portion of said Hall element;
   (d) a first layer of a high magnetic permeability material over said one surface of said die overlying said basic Hall element; and
   (e) a second layer of a high magnetic permeability material over said opposite die surface extending into said basic trench and lying adjacent to said inner-die portion of said basic Hall element, said first and second layers serving as two pole pieces intimately sandwiching said basic Hall element.

2. The integrated Hall sensor of claim 1 wherein the magnetic permeability of said two intimate pole pieces is at least a factor of 10 greater than that of free space.

3. The integrated Hall sensor of claim 1 wherein said two intimate pole pieces extend to one edge of said die to form a high resolution magnetic-field-sensing pole-pieces gap there.

4. The integrated Hall sensor of claim 3 wherein said gap is about as wide as the thickness of said die.

5. The integrated Hall sensor of claim 3 additionally comprising another trench formed in said opposite die surface at said one die edge, said intimate pole piece composed of said second high magnetic permeability material extending into said another trench so that said high resolution magnetic-field-sensing pole-pieces gap has a dimension significantly less than the thickness of said die.

6. The integrated Hall sensor of claim 3 additionally comprising:
   (a) at least a second Hall element and formed in said die at said one die surface;
   (b) at least a second trench formed in said opposite die surface adjacent an inner die portion of said second Hall element;
   (c) a third layer of a high magnetic permeability material over said one surface of said die overlying said second Hall element and extending to said one die edge; and
   (d) a fourth layer of a high magnetic permeability material over said opposite die surface extending into said second trench and adjacent to said second Hall element, and extending to said die edge so that said integrated Hall sensor is capable of simultaneously reading signals on dual tracks of a magnetic tape, disc or the like.

7. The integrated Hall sensor of claim 1 wherein said intimate pole pieces extend over said surfaces only in areas adjacent to said Hall element, and additionally comprising two high-magnetic-permeability blocks mounted respectively against at least a portion of said one and another intimate pole pieces; and an insulating resin encapsulating said die and forming a package thereabout, one surface of each of said blocks extending to opposite outer surfaces of said package.

8. The integrated Hall sensor of claim 1 wherein said material of at least one of said high-magnetic-permeability layers is comprised of a ferromagnetic metal.

9. The integrated Hall sensor of claim 8 additionally comprising an electrically insulating layer being interposed between said die and said metal.

* * * * *